United States Patent [19]
Singer et al.

[11] Patent Number: 4,906,897
[45] Date of Patent: Mar. 6, 1990

[54] IMAGE INTENSIFIER TUBE

[75] Inventors: Barry M. Singer, New York, N.Y.; Amos Picker, Sharon, Mass.

[73] Assignee: Varian Associates, Inc., Palo Alto, Calif.

[21] Appl. No.: 124,388

[22] Filed: Mar. 15, 1971

[51] Int. Cl.[4] ...................... H01T 29/41; H01L 25/00

[52] U.S. Cl. .................................... 315/12.1; 250/332; 250/333; 313/366

[58] Field of Search ................................ 315/12, 12.1; 250/83.3 H, 83.3 HP, 213 VT, 332, 333; 313/68 A, 103, 366

[56] References Cited

U.S. PATENT DOCUMENTS

| | | | |
|---|---|---|---|
| 3,548,193 | 12/1970 | Wendland | 250/83.3 HP |
| 3,553,518 | 1/1971 | Schagen | 313/94 |
| 3,575,628 | 4/1974 | Word | 250/213 VT X |
| 3,596,097 | 7/1971 | Robillard | 250/213 VT X |
| 3,660,668 | 5/1972 | Wolski | 315/120 X |
| 3,676,677 | 7/1972 | Condas | 250/83.3 H |

*Primary Examiner*—Peter A. Nelson
*Attorney, Agent, or Firm*—Stanley Z. Cole; John C. Yakes; David Schnapf

[57] ABSTRACT

An image intensifier tube comprising an input screen assembly which includes a photosensitive semiconductor wafer having a substrate of one conductivity type material forming a plurality of P-N junctions with a planar array of mutually isolated islands of opposite conductivity type material, the islands protruding substantially equal distances from a common surface of the substrate, an opaque film of resistive material overlying the exposed areas of the islands and the common surface of the substrate, a layer of electroluminescent material disposed in abutting relationship with the distal ends of the islands and a layer of photoemissive material disposed in axially aligned relationship with the electroluminescent layer.

7 Claims, No Drawings

IMAGE INTENSIFIER TUBE

BACKGROUND OF THE INVENTION

This invention relates generally to light amplifier tubes and is concerned more particularly with image intensifier tubes utilized for direct viewing of objects illuminated by visible or invisible radiation.

An image intensifier tube is a device for converting a radiational image of an external object directly into a bright visual image. Generally, an image intensifier tube comprises a tubular envelope having an input screen assembly disposed adjacent a radiation transparent faceplate at one end of the envelope and an imaging screen assembly disposed adjacent an output faceplate at the other end. The input screen assembly usually includes a transparent film of conductive material which serves as the cathode electrode and a superimposed layer of photoemissive material which functions as the photocathode of the tube. The imaging screen assembly generally includes a layer of phosphor material which functions as the imaging screen anode and an overlying film of conductive material which serves as the anode electrode of the tube. Usually, the anode is maintained at a high positive potential with respect to the cathode for the purpose of establishing a strong electrostatic field between the photocathode and the imaging screen.

In operation, photons of radiant energy emanating from localized areas of an external object pass through the input faceplate of the image intensifier tube and impinge on corresponding localized areas of the photocathode. As a result, the photocathode emits an equivalent electron image which is accelerated by the strong electrostatic field toward the imaging screen assembly at the other end of the tube. The accelerated electron image, thus amplified, impinges on the phosphor layer of the imaging screen assembly with sufficient kinetic energy to produce a corresponding visual image which may be viewed through the output faceplate of the tube.

Image intensifier tubes have been developed for converting faint visible light images directly into bright visible images. However, similar attempts to develop an image intensifier tube which converts infrared radiational images directly into bright visible images have not been too successful. Because of the comparatively low energy quanta associated with infrared wavelengths, a two transitional energy level technique generally is employed in image intensifier tubes of the prior art. Thus, electrons in the photocathode material usually are excited to higher energy levels by an auxiliary source of radiation, commonly referred to as the "pumping" source. In this manner, an infrared radiational image impinging on the photocathode can raise the excited electrons up to the energy level required for producing a corresponding visible light image. However, the described method requires two radiational sources to produce the desired result and, consequently, is highly inefficient and expensive. Therefore, there is a definite need for an image intensifier tube which can convert infrared radiational images directly into visible light images without the aid of a "pumping" source of radiation.

SUMMARY OF THE INVENTION

Accordingly, this invention provides an image intensifier tube having an evacuated envelope, a portion of which comprises an input faceplate, and an input screen assembly disposed within the envelope, adjacent the input faceplate. The input screen assembly includes a semiconductor wafer, an electroluminescent layer and a photocathode disposed in axially aligned relationship with one another. The semiconductor wafer comprises a substrate of one conductivity type material having on one surface thereof an electrically conductive layer of radiation transparent material which is disposed in opposing relationship with the input faceplate of the tube. The opposite surface of the substrate is provided with a planar array of mutually isolated islands of opposite conductivity material, each island forming a respective P-N junction with the substrate and extending outwardly from said substrate surface the same distance as the other islands. A film of semi-insulating material overlies the exposed areas of the islands and the adjacent substrate surface. Abutting the distal ends of the islands is an electroluminescent layer having an opposite surface coated with a transparent film of electrically conductive material. Superimposed on this film is a layer of photoemissive material which constitutes the photocathode of the tube. Axially spaced from the photocathode and aligned therewith is a microchannel plate having opposing metallized surfaces which constitute respective electrodes of the tube. Axially spaced from the microchannel plate and aligned therewith is an imaging screen assembly comprising a film of electrically conductive material which serves as the anode electrode and a supporting layer of phosphor material which functions as the imaging screen of the tube. The layer of phosphor material may be deposited on the inner surface of a transparent output faceplate which may constitute a portion of the tube envelope.

In the preferred embodiment, a direct current voltage is resistively connected between the photocathode, the metallized surfaces of the microchannel plate and the imaging screen, such that electrons emitted by the photocathode are accelerated toward the microchannel plate and electrons emerging from the microchannel plate are accelerated toward the imaging screen. Furthermore, an alternating voltage source is connected across the input screen assembly, such that during one half cycle of alternating voltage the semiconductor is forward biased and the major portion of the voltage is applied across the electroluminescent layer. During the other half cycle of alternating voltage, the semiconductor is reverse biased and, in the absence of incident radiation, the major portion of the voltage is applied across the semiconductor.

BRIEF DESCRIPTION OF THE DRAWING

For a better understanding of this invention, reference is made to the drawing wherein:

FIG. 1 is an exaggerated, side elevational view, in axial section, of a tube embodying the invention;

FIG. 2 is an enlarged fragmentary view, in axial section, of the input screen assembly shown in FIG. 1; and FIG. 3 is a fragmentary cross-sectional view taken along the line 3—3 shown in FIG. 2, looking in the direction of the arrows.

DESCRIPTION OF THE PREFERRED EMBODIMENT

Referring more particularly to the drawing wherein like characters of reference designate like parts, there is shown greatly exaggerated in FIG. 1 an image intensifier tube having an evacuated envelope 10 closed at one end by a thin disc 12 which is peripherally sealed to a supporting ring 14 made of conductive material, such as kovar, for example. The disc 12, commonly referred to as the "input faceplate" of the tube, is made of a material, such as glass, for example, which is sealed in a conventional manner to the ring 14 and is transparent to infrared radiation. Disposed against the inner surface of faceplate 12 and axially aligned therewith is an input screen assembly 16 comprising a semiconductor wafer 18 having a substrate portion 20 made of N-type conductivity material, such as gallium antimonide, for example, which is photosensitive to incident infrared radiation. As shown more clearly in FIG. 2, a surface of substrate 20 is disposed adjacent the faceplate 12 and is coated, as by sputtering, for example, with a thin film 22 of conductive material, such as tin oxide, for example, which is transparent to infrared radiation. The film 22 extends radially beyond the periphery of faceplate 12 and electrically contacts the ring 14. Thus, the ring 14 and contacting film 22 constitute the first electrode of the tube.

Protruding from the opposite surface of substrate 20, as shown more clearly in FIG. 3, is a planar array of mutually isolated islands 24, each island comprising a region of P-type conductivity material which forms a respective P-N junction 25 with the interfacing N-type material of substrate 20. Preferably, the P-type islands 24 are substantially uniform in size, shape and height. This mosaic array of semiconductor diodes may be formed, for example, by utilizing a well-known photoresist technique to expose suitably spaced areas of the substrate surface and diffusing therein a P-type impurity material, such as zinc, for example, thus forming isolated regions of P-type conductivity material in the substrate. Subsequently, the N-type conductivity material between the P-type conductivity regions may be removed, as by selective etching, for example, until the resulting islands of P-type conductivity have the desired heighth, such as five to ten microns, for example, with respect to the adjacent surface of substrate 20. In this manner, the P-type islands 24 may be spaced as close as required to obtain the desired image resolution.

The exposed areas of the islands 24 and the adjacent surface of substrate 20 are coated, as by evaporation, for example, with a thin layer 26 of resistive material, such as antimony trisulfide, for example, which is opaque to visible light and presents a lower resistance to current flowing in the direction of its thickness than to current flowing orthogonally thereto. Disposed against the coated distal end surfaces of the islands 24 and therefore physically spaced from the adjacent coated surface of substrate 20 is an electroluminescent layer 28 of phosphor material, such as zinc sulfide, for example. To achieve this objective, the wafer 18 may be dipped into a lacquer having a nitrocellulose base and, after deposition thereon of sufficient phosphor material to form layer 28, the resulting assembly may be baked in air at a suitable temperature for vaporizing the lacquer, such as 350° C.–400° C., for example. Thus, the nitrocellulose base lacquer, being very volatile, will burn off completely and leave the electroluminescent layer disposed as described. The opposing surface of the electroluminescent layer 28 is coated, as by sputtering, for example, with a thin film 30 of conductive material, such as tin oxide, for example, which is transparent to visible light. The portion of input screen assembly 16, thus described, is encircled by a spaced sleeve 33 of dielectric material, such as ceramic, for example, which is peripherally sealed at one end to contact ring 14 and similarly sealed at the opposite end to a contact ring 32. An annular portion of ring 32, adjacent the inner periphery thereof, is disposed in electrical contact with an annular portion of conductive film 30, adjacent its outer periphery. Thus, contact ring 32 and conductive film 30 constitute a second electrode of the tube. On the inner surface of film 30 and within the opening of ring 32, there is deposited a layer 34 of photoemissive material, such as sodium potassium cesium antimonide, for example, which functions as the photocathode of the tube. Thus, the input screen assembly for the image intensifier tube of this invention comprises conductive film 22, semiconductor wafer 18, insulating layer 26, electroluminescent layer 28, conductive film 30 and the photocathode 34.

Coaxially disposed in spaced parallel relationship with the photocathode 34 is a microchannel plate 40 comprising a glass disc having a plurality of through holes 42 extending between opposing flat surfaces 41 and 43, respectively. The surfaces 43 and 44 are coated, as by deposition, for example, with a suitable metal, such as gold, for example. The metallized surface 41, adjacent the photocathode 34, has an outer annular portion hermetically attached, by conventional means, to a contact ring 44 of conductive material, such as kovar, for example. Thus, ring 44 and metallized surface 41 constitute a third electrode of the tube. The ring 44 is circumferentially sealed to one end of a hollow cylinder 45 which is made of dielectric material, such as ceramic, for example, and which is similarly sealed at the other end to the contact ring 32. Extending through the wall of cylinder 45 is an exhaust tubulation 47 through which the envelope 10 is evacuated during processing of the tube and which is sealed off after processing is completed. The metallized surface 43 of plate 40 has an outer annular portion hermetically attached, by conventional means, to a contact ring 46 made of conductive material, such as kovar, for example. Thus, the ring 46 and metallized surface 44 constitute a fourth electrode of the tube.

The contact ring 46 is circumferentially sealed to one end of a hollow cylinder 49 which is made of dielectric material, such as ceramic, for example, and which is peripherally sealed at its opposite end to a contact ring 50 made of conductive material, such as kovar, for example. Extending across the opening of ring 50 and circumferentially sealed to the inner periphery thereof is a disc 52 which closes the other end of tubular envelope 10. The disc 52, commonly referred to as the "output faceplate" of the tube is made of a material, such as glass, for example, which is transparent to visible light and is sealed to contact ring 52 in a conventional manner. The inner surface of faceplate 52 supports an imaging screen assembly 54 comprising a layer 56 of phosphor material, such as zinc cadmium sulfide, for example, which is disposed adjacent the faceplate 52 and functions as the imaging screen of the tube. Overlying the inner surface of layer 56 is a thin film 58 of conductive material, such as aluminum, for example, which is transparent to accelerated electrons and reflects visible light emitted by the imaging screen toward the output faceplate of the tube. The film 58 extends radially beyond the periphery of imaging screen 56 and electrically contacts the conductive ring 50. Thus, the film 58 and contact ring 50 constitute a fifth electrode of the tube.

In operation, a high voltage, direct current source 60 is connected across a voltage divider 62 comprising series connected resistive elements 64, 66 and 68, respectively. The positive side of the DC voltage source 60 is connected to one end of resistive element 68 and contact ring 50 of the tube thereby applying the maximum DC voltage to the film 58 of imaging screen assembly 54. The junction of resistive elements 68 and 66 is connected to contact ring 46 thereby applying a relatively lower DC voltage to the metallized surface 43 of microchannel plate 40. The junction of resistive elements 66 and 64 is connected to contact ring 44 thereby applying a still lower value of DC voltage to the metallized surface 41 of plate 40. The zero or ground potential side of the DC voltage source 60 is connected to the other end of resistive element 64 and the contact ring 32 thereby applying a minimum DC voltage to the photocathode 34. As a result, respective electrostatic fields are established between the photocathode 34 and the adjacent surface 41 of plate 40, between the opposing surfaces 41 and 43 of plate 40 and between the surface 43 of plate 40 and the imaging screen 56. Thus, the contact ring 32 serves as the cathode terminal of the tube and contact ring 50 as the anode terminal.

An alternating voltage source 70 is connected between contact rings 14 and 32, respectively, thereby applying an alternating voltage across semiconductor wafer 18, resistive layer 26 and electroluminescent layer 28. The resistive layer 26, being in the order of 200–500 angstroms in thickness, constitutes a relatively low impedance in the axial direction. Consequently, during the AC half-cycle when the film 24 is negative with respect to the film 30, the semiconductor diodes of wafer 18 are forward biased and this first half-cycle voltage is applied predominantly across the electroluminescent layer 28. However, during the other half-cycle when the film 14 is positive with respect to the film 30, the semiconductor diodes of wafer 18 are reverse biased and this second half-cycle voltage is applied predominantly across the semiconductor wafer 18. Thus, in the absence of incident radiation, the root mean square or RMS voltage applied across the electroluminescent layer 28 does not attain the critical value required for producing luminescence.

Infrared radiation emanating from a coherent source, such as a neodymium laser, for example, is passed through a diffusing lense and illuminates an external object of interest. Thus, the infrared radiation reflected in varying degrees of intensity from localized areas of the object forms a radiational image thereof which is transmitted to the input faceplate 12 of the tube. After passing through the infrared transparent faceplate 12 and conductive film 22, the radiational image impinges on the adjacent surface of substrate 20. As a result, photons of infrared energy penetrate incremental regions of the substrate material and generate electron-hole pairs therein in accordance with the spatial distribution of intensity in the impinging image.

When the semiconductor diodes of the wafer 18 are reverse biased, there is formed at each junction 25 a respective space charge region where electrostatic field intensity is concentrated. As a result, the free charge carriers generated by the incident infrared image are drawn to respectively aligned junctions 25 where they neutralize an equivalent number of donor and acceptor ions. Thus, the respective junctions 25 are partially discharged in accordance with the spatial distribution of intensity in the infrared image and the half cycle AC voltage applied across aligned regions of the layer 28 increases correspondingly. Consequently, the RMS value of the voltage applied across localized regions of the electroluminescent layer 28 can attain the critical value for producing luminescence. Thus, the electroluminescent layer 28 will emit a visible light image of the external object. Since the resistive layer 26 is opaque to visible light, the image emitted by layer 28 will not pass through resistive layer 26 to affect the operation of photosensitive semiconductor 18. On the other hand, the adjacent film 30 is transparent to visible light and therefore the image emitted by layer 28 will pass through film 30 to impinge on the adjacent surface of photocathode 26. As a result, localized regions of the photocathode 26 will emit electrons in accordance with the spatial distribution of intensity in the visible light image emitted by the electroluminescent layer 28. Thus, the photocathode 26 emits what may be considered as an electron image of the external object.

The electrostatic field established between the photocathode 26 and the microchannel plate 40 accelerates the electron image emitted by the photocathode toward the microchannel plate before substantial spreading of the image can occur. Consequently, the electrons in the image, thus accelerated, enter substantially aligned holes 42 of the plate 40 and impinge on the respective walls thereof. As a result, a high secondary emission of electrons is produced within the holes 42 whereby the electron density of the image is increased substantially. Due to the electrostatic field established between the opposing surfaces 41 and 43, respectively, of plate 40 this amplified electron image emerges from the plate 40 and enters the electrostatic field established between the plate 40 and the imaging screen 58. The strength of this last-mentioned electrostatic field is such that, before lateral spreading can take place, the electrons in the image are accelerated toward the imaging screen 58 at relatively high velocity, thereby attaining higher levels of kinetic energy. Consequently, the accelerated electron image passes through the transparent conductive film 58 and impinges on the imaging screen 58 with sufficient force to produce an emission of visible light photons from corresponding areas of the phosphor material of the imaging screen. Thus, the imaging screen 58 produces a bright visible light image which may be viewed through the transparent output faceplate 52 of the tube. In this manner, the image intensifier tube of this invention converts an infrared image of an external object into a visible light image for direct viewing purposes.

Although the substrate 20 has been described herein as being made of gallium antimonide, other semiconductor materials may be used in place thereof, such as silicon or germanium, for examples, which also are photosensitive to infrared radiation. Furthermore, the resistive layer 26 need not be made of antimony trisulfide but alternatively may be made of arsenic triselenide, zinc cadmium selenide, antimony triselenide or any other material or combination of materials which is opaque to visible light and presents a lower impedance in the direction of its thickness rather than transversely thereto in order to avoid lateral spreading of the image. Also, the zinc sulfide material of electroluminescent layer 28 may be replaced by another material, such as zinc cadmium sulfide, which also will provide localized luminescence when a critical voltage is applied across a thickness thereof. Moreover, the material of the tin oxide films 22 and 30, respectively, alternatively may be made of cadmium oxide, for example, or any other conductive material which will be transparent in the direction of its thickness to the radiation of interest.

Therefore, the film 22, for example, alternatively may comprise a layer of N+ conductivity material formed, in any suitable manner, on the planar surface of substrate 20 adjacent the input faceplate 12.

Thus there has been disclosed herein an image intensifier tube comprising an evacuated envelope having a portion thereof which serves as an infrared transparent faceplate and disposed within the envelope, adjacent the faceplate, an input screen assembly comprising adjacent layers of infrared sensitive semiconductor material, electroluminescent material and photoemissive material. It will be apparent that the objectives of this invention have been achieved by the structures shown and described herein. However, it also will be apparent that various changes may be made by those skilled in the art without departing from the spirit and scope of this invention as expressed in the appended claims. It is to be understood, therefore, that all matter shown and described herein is to be interpreted as illustrative and not in a limiting sense.

I claim:

1. An image intensifier tube comprising:
an evacuated envelope having an input faceplate and an output faceplate;
an input screen assembly disposed within the envelope and axially aligned with the input faceplate, said input screen assembly including:
a semiconductor wafer having a substrate of one conductivity-type material disposed adjacent the input faceplate and having a plurality of mutually isolated islands of opposite conductivity-type material disposed in the inner surface of the substrate, each island forming a respective P-N junction with the interfacing material of the substrate and having a respective exposed surface portion;
a layer of electroluminescent material disposed adjacent said plurality of mutually isolated islands and axially aligned therewith;
a photocathode disposed adjacent the electroluminescent layer and axially aligned therewith; and
resistive means for electrically connecting respective islands of said opposite conductivity-type material with aligned incremental regions of the electroluminescent layer;
an output screen assembly disposed within the envelope and axially aligned with the output faceplate, said output screen assembly including an imaging screen disposed adjacent the output faceplate; and
electrode means for impressing a voltage across the mosaic array and the electroluminescent layer, and for establishing an electrostatic field between the photocathode and the imaging screen.

2. An image intensifier tube as set forth in claim 1 wherein said resistive means comprises a layer of resistive material disposed on the surface of the mosaic array adjacent the electroluminescent layer, and the electroluminescent layer is disposed in electrical contacting relationship with said resistive layer.

3. An image intensifier tube as set forth in claim 2 wherein the resistive layer is a laterally biased resistive layer.

4. An image intensifier tube as set forth in claim 3 wherein the resistive layer is an ocular opaque, resistive layer.

5. An image intesifier tube comprising:
an evacuated evelope having an input faceplate and an output faceplate;
a semiconductor wafer disposed within the envelope, adjacent the input faceplate and axially aligned therewith;
said wafer having a substrate of one conductivity-type material disposed adjacent the input faceplate and having a plurality of mutually isolated islands of opposite conductivity-type material disposed in the inner surface of the substrate, each island forming a respective P-N junction with the interfacing material of the substrate and having a respective exposed surface portion;
a coating of resistive material disposed on the inner surface of the substrate and exposed surface portions of the islands;
a layer of electroluminescent material disposed on the resistive coated portions of said plurality of islands;
a layer of photoemissive material disposed adjacent the inner surface of the electroluminescent layer and axially aligned therewith;
a layer of luminescent material disposed within the envelope, adjacent the output faceplate and axially aligned therewith;
a micro-channel plate disposed between the photoemissive layer and the luminescent layer, and in axially aligned spaced relationship therewith; and
electrode means for impressing a voltage across the semiconductor wafer and the electroluminescent layer, and for establishing an electrostatic field between the photoemissive layer and the luminescent layer.

6. An image intensifier tube as set forth in claim 5 wherein said plurality of islands extend away from said inner surface of the substrate.

7. An image intensifier tube as set forth in claim 5 wherein said one conductivity-type material is N-type and said opposite conductivity-type material is P-type.

* * * * *